(12) United States Patent
Hanson

(10) Patent No.: US 6,411,109 B1
(45) Date of Patent: Jun. 25, 2002

(54) CONNECTING LUG USED AS A CURRENT-SENSE RESISTOR

(75) Inventor: Michael Hanson, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 0 days.

(21) Appl. No.: 09/575,343

(22) Filed: May 19, 2000

(51) Int. Cl.[7] ............................................... G01R 27/08
(52) U.S. Cl. ........................ 324/691; 324/522; 338/309
(58) Field of Search ................... 324/691, 522, 324/525, 421; 318/254, 143, 144; 252/512, 513; 338/309; 216/16

(56) References Cited

U.S. PATENT DOCUMENTS 5,191,269 A * 3/1993 Carbolante ................. 318/254
5,354,509 A * 10/1994 Kuo ........................... 252/512
5,883,495 A * 3/1999 Smith et al. ................ 320/128

* cited by examiner

*Primary Examiner*—N. Le
*Assistant Examiner*—Anjan K. Deb
(74) *Attorney, Agent, or Firm*—Eugene V. Feldman

(57) ABSTRACT

A lug with relatively small resistance is provided that allows current to be determined between a source and a load by measuring the voltage drop across the lug. The voltage drop is sufficient to be above the electronic noise, and yet the resistance of the lug is low enough so that the heat produced by current flow is small compared with the heat generated by the source. The material comprising the lug is of a type and strength to be readily manufactured, and its resistivity varies by a relatively small amount with temperature.

14 Claims, 3 Drawing Sheets

US 6,411,109 B1

CONNECTING LUG USED AS A CURRENT-SENSE RESISTOR

FIELD OF THE INVENTION

This invention relates to a current-sense resistor, and more particularly to a current-sense resistive lug used as a connector in a hybrid power module.

BACKGROUND OF THE INVENTION

Electrical and electronic applications frequently use modules for many purposes. A module comprises several electronic components such as transistors connected in a standard arrangement in one package. Monolithic modules, also known as integrated circuits, consist of one piece of semiconductor material, typically silicon. Hybrid, or multi-chip, modules consist of two or more pieces of semiconductor material connected to one substrate.

Modules have the principal advantage of saving cost and speeding manufacturing compared with hand-assembled components. In addition, all the heat from a module is dissipated in one surface. This may aid in the design of the device that incorporates the module.

One use of modules is in control circuits for electric motors. These modules may be used as inverters to convert DC to AC to power a motor. It is often useful to measure the current between one or more transistor switches within the module and a resistive or inductive load. The load may be a motor winding connected to the transistor switches. The modules may be used instead to convert AC to DC, that is, as synchronous rectifiers. In that application, it may be useful to measure the current at the input to the transistor switches.

A current measurement may be used to protect the switch or the load from damage. Secondly, the measurement may be used to control the torque of the motor. Thirdly, the measurement may be used to control the positional state of the motor, for example, the angle of rotation. For these and other reasons, it is desirable to measure the current. The measured current may be DC or AC, and the AC current may be sinusoidal, square wave, or other waveforms.

In several prior approaches, devices external to the module, or additional devices within the module, were used to measure current. The laws of physics allow current to be measured in only a few ways. For example, Hall effect transducers are known in the art. Secondly, current transformers are well known in the art. Thirdly, additional current-sense resistor shunts within or external to the module are well known. Finally, it is also known to use transistors having Kelvin connections. Shunt resistors or Kelvin connections carry a fraction of the current to be measured.

In an application in which power transistors are mounted on a substrate to form a switch in a module, a sense resistor might be made part of the substrate. The resistor might also be mounted at right angles to the substrate. However, all the designs described herein before require space, add weight, generate heat, and increase the expense or difficulty of manufacturing the hardware.

It is known to use a conducting lug, for example, one made of tinned copper, to connect cables or bus bars to transistor switches, or to other electronic components. A lug is simply a projection on a metal part that is used as a connection. These prior lugs could not be used to sense current because the voltage drop across them would be near zero, and would be lost in the noise.

DISCLOSURE OF THE INVENTION

Accordingly, an object of the present invention is to provide a current-sense apparatus that will fit within a power module.

Another object of the invention is to provide a current-sense lug with relatively small resistance that allows current to be determined by measuring the voltage drop across the lug.

Still another object of the invention is that the voltage drop across the lug is sufficient to be above the electronic noise, and yet the resistance of the lug is low enough so that the heat produced is small compared with the heat generated by the transistor switches.

Yet another object of the present invention is that the resistance of the lug varies by only a relatively small amount with temperature.

A further object of the present invention is that the material comprising the lug is of a type and strength to be readily manufactured.

Another object of the invention is that the lug has sufficient strength to help fasten a cable end to transistor switches. The term "cable" as used herein should be understood to mean a cable, a bus bar, or other similar devices for conducting electricity.

Yet another object of the invention is that the lug carries the entire current to be measured.

Still another object of the invention is that the lug is used not only to secure the cable, but also to sense current, so that the current-sense function takes up no additional space in the module.

A major step in the invention is the recognition that the existing means to connect a cable to a transistor switch can also be used to sense current if the resistance value of the connector lug is of a certain, predetermined value.

According to the invention, a power hybrid module has at least one transistor connected as a switch, a cable connecting the output point of the switch to an inductive or resistive load such as a motor winding, and a lug that fastens and electrically connects the cable to the output point of the switch. The lug has a predetermined, known resistance value that allows the current in the cable to be determined by measuring the voltage drop across the lug, the lug resistance varies minimally with temperature, and the lug material has sufficient strength to be manufactured and to help fasten the cable.

The invention has utility because it provides a miniature current-sense apparatus that fits within a power module. No additional parts are used, no additional space is needed, no weight is added, and relatively little heat is dissipated. The material comprising the lug costs little compared with the remainder of the module. The material is of a type and strength to be readily manufactured. Current is determined by measuring the voltage drop across the lug, which electrically connects and physically attaches the cable to the transistor switch. Unlike prior shunt resistors or Kelvin connections, the lug carries the entire current. The lug is used, therefore, not only to attach the cable, but also to sense current; hence, the current-sense function takes up no additional space in the module. The voltage drop across the lug is sufficient to be above the electronic noise. The heat produced by the lug, however, is small compared with the heat generated by the transistor switches. The current-sense process is nearly linear because the resistance of the lug varies by only a relatively small amount with temperature.

The above and other objects, features, and advantages of this invention will become apparent when the following description is read in conjunction with the accompanying drawings.

DETAILED DESCRIPTION OF THE PREFERRED EMBODIMENTS

Figure 1:
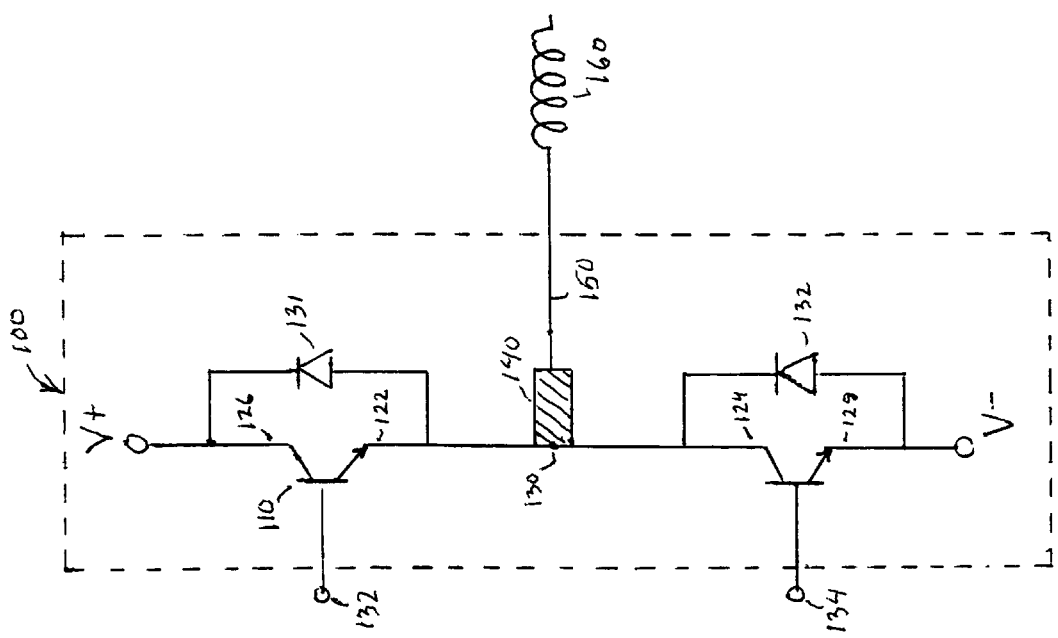
FIG. 1 is an electrical schematic diagram of a hybrid power module driving an inductive load through a lug.

As illustrated schematically in FIG. 1, a hybrid power module 100 consists of two bipolar transistors 110 and 120 connected as a switch. The emitter 122 of the first transistor 110 is connected to the collector 124 of the second transistor 120. The collector 126 of the first transistor 110 is connected externally to a positive DC power source V+, while the emitter 128 of the second transistor 120 is connected to a negative DC power source V−, which may be ground. The emitter of the first transistor 110 and collector 124 of the second transistor 120 are connected together at a pad 130. A first flyback diode 131 is connected between the collector and emitter of first transistor 110 for control. A second flyback diode 132 is connected between the collector and emitter of second transistor 120. The bases 132, 134 of the two transistors form the inputs to the switch.

The signals at the switch inputs are relatively large in magnitude so that the transistors are either "on" or "off" (i.e., the transistors 110, 120 are each operated as a switch). When the second transistor 120 is on (or active mode), and the first transistor 110 is off, the voltage between the collector and emitter, Vce, for the second transistor 120 is relatively small (e.g., approximately 0.2 V for a silicon bipolar transistor). The negative DC power source V− (or ground) then acts as though it were attached to the output pad 130; therefore, the output is relatively small or negative. When the second transistor 120 is off, the Vce of the second transistor 120 acts as an open circuit (Vce has relatively high resistance). When the first transistor 110 is on, Vce is relatively small, so V+ is seen by the output 130. Thus, the output 130 of the module alternates between V+ and V−.

A lug 140 connects the pad 130 to a first end of a cable 150. The term "cable" as used herein should be understood to mean a cable, a bus bar, or other similar devices for conducting electricity. The second end of the cable is connected to a load 160. This load may be inductive, as illustrated in FIG. 1, resistive, or a mixture of the two. The current in the load is greater than the current at the input; the module 100 acts as a gate that switches a larger current controlled by a smaller current.

Figure 2:
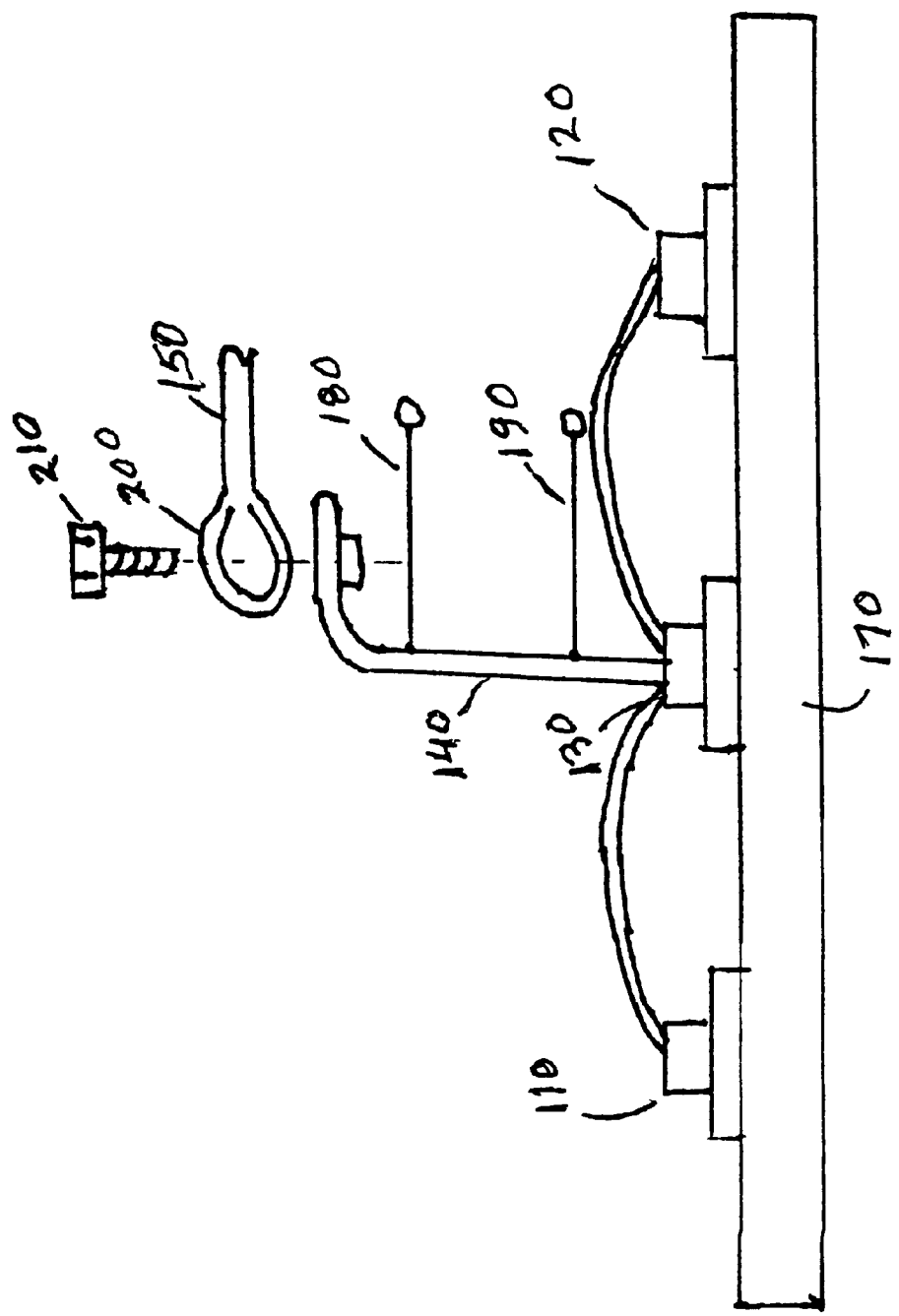
FIG. 2 is a cutaway side view, partially exploded, of the hybrid power module of FIG. 1.

In FIG. 2, transistors 110 and 120 are mounted on a substrate 170. The transistors are connected at the pad 130. The lug 140 has lower and upper ends. The lower end is rigidly attached to the pad 130. The upper end of the lug is connected to the cable 150 by means of a fastener 200 and a screw 210. Wires 180 and 190 are connected near the first and second ends of the lug.

Figure 3:
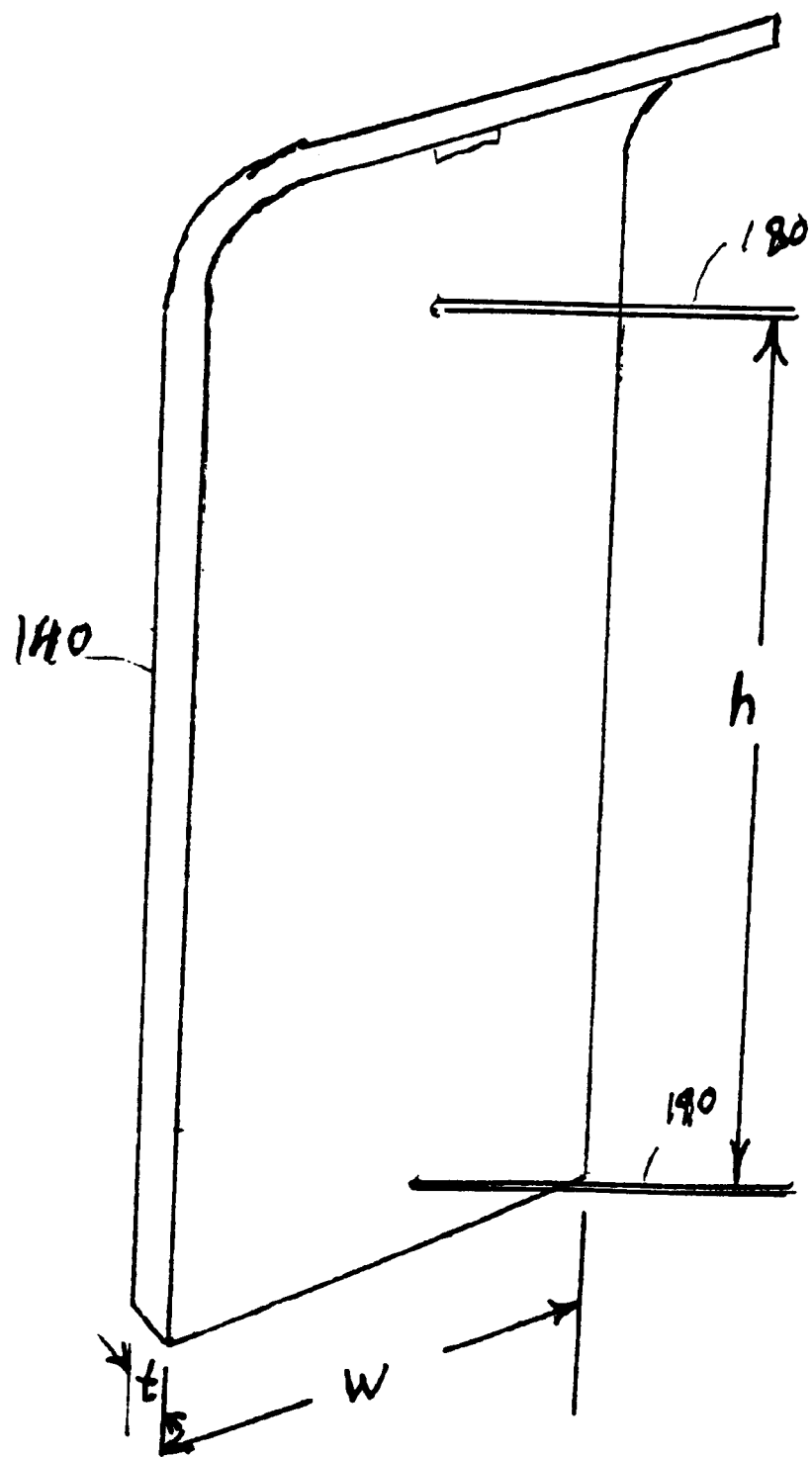
FIG. 3 is an isometric view of the lug in the hybrid power module of FIG. 2.

Referring to FIG. 3, the lug 140 shown in isometric view in the preferred embodiment can be made of various materials. The lug can be mass-produced by forming or stamping it from sheets of the material and bending as required. The preferred material will be discussed in more detail herein below. The lug 140 has a predetermined width w and thickness t. The height h is the distance between the junctions of the connecting wires 180 and 190 with the lug.

Equation 1 can be used to compute the electrical resistance R of the lug between the connecting wires 180 and 190:

$$R = \rho h / wt \quad \text{Eq.1}$$

where ρ is the resistivity, also called specific resistance, of the lug material. Resistivity of a material is the resistance between two parallel faces that a cubic centimeter offers to electricity flowing perpendicular to the two faces. Resistivity is usually expressed in ohm-meters, that is, resistance times distance.

It is often desirable to measure a current I at the input or output of the module 100. A current measurement may be used to protect the switch or the load from damage. The measurement may be used to control the torque or the angle of rotation of the motor. For these and other reasons, it is desirable to measure the current, which may be DC or AC. Because all the current passes through the lug 140, and the resistance R of the lug is known, one skilled in the art will realize that Eq. 2 (Ohm's law) can be used to measure I:

$$I = V/R \quad \text{Eq.2}$$

Where V is the voltage drop measured between wires 180 and 190. The voltage can be measured with a difference amplifier or other circuitry.

When the hybrid power module 100 is used to drive a motor winding 160, including possibly a three-phase motor winding, typical currents between a few amperes and many hundred amperes may pass through the lug 140. In order to measure the current with accuracy, the lug is designed to produce a voltage drop of about 50 to 500 mV. This is sufficient to be above the electrical noise, but small enough so that negligible heat, measured by I times I times R, is produced by the required resistance of the lug. Depending upon the current for the application involved, the predetermined resistance value of the lug 140 may be between 0.5 milliohm and 250 milliohms. Because the size of the lug may vary, the resistivity of the lug material may between 500 and 2000 nano-ohm-meters. To achieve linear current sense capability, the resistance value of the lug must vary with temperature by no greater than ±30 parts per million per degree Celsius.

Typical dimensions for the lug 140 to fit within a hybrid power module 100 are a width w and a height h of a relatively small number of centimeters, and a thickness t of a relatively few tenths of a centimeter. Using Eq. 1, a resistivity of a few hundred to a few thousand nano-ohm-meters (nΩ-m), and preferably between 300 and 3000 nΩ-m, is necessary for the lug material.

In the preferred embodiment, the lug 140 is made of a resistance alloy that has the following properties:

a) uniform resistivity throughout;

b) stable resistance with time;

c) relatively high ductility and mechanical strength for ease of manufacture;

d) ability to be soldered or welded;

e) relatively small temperature coefficient, that is, change of resistance with temperature;

f) relatively small thermoelectric potential with copper;

g) relatively good corrosion resistance; and h) low cost compared with the module.

Nickel-base alloys have properties a) through h). Thus, these alloys are used in the preferred embodiment. For example, an alloy of 76 nickel-17 chromium-4 silicon-3 manganese has a resistivity of 1330 nΩ-m. The temperature coefficient of resistance for this alloy is ±20 parts per million per ° C. Its thermoelectric potential is −1 μV per ° C. versus copper, and its tensile strength is 900–1380 Mpa.

Thus, the current-sense lug 140 of the invention provides a highly reliable, compact means to measure current in a module without overheating the module 100 or adding size, complexity, cost, or weight.

This invention of a current-sense lug has been illustrated and described with respect to a specific embodiment thereof. It should be understood by those skilled in the art that this is not an exclusive embodiment. Although this invention is described in detail for use in a hybrid power module with bipolar transistors, those skilled in the art will realize that other types of transistors or other electronic components may be connected to the current-sense lug. In particular, CMOS or MOSFET switches, insulated gate bipolar transistors (IGBTs), or other semiconductors may be used instead of bipolar transistors.

The current-sense lug can be made in any size or shape. Wires 180 and 190 can be replaced by connections already in place to the two ends of the lug, although some accuracy may be sacrificed. Those skilled in the art will also realize that the present invention can be used anywhere that current needs to be measured in a reliable, compact manner. The lug need not be inside a module.

In fact, the invention need not be in the form of a lug; the invention can be a component of relatively small resistance used in any electrical application. Obvious size, shape, and material modifications to the current-sense device can be made without departing from the spirit and scope of the invention. Accordingly, the scope of the invention should be determined not by the embodiments in the foregoing specification, but by the appended claims and their legal equivalents.

All the foregoing variations are irrelevant. It suffices for the invention that a power hybrid module has at least one transistor connected as a switch, a cable connecting the output point of the switch to an inductive or resistive load, and a lug that fastens and electrically connects the cable to the output point of the switch. The lug has known resistance that allows the current in the cable to be determined by measuring the voltage drop across the lug, the lug resistance varies minimally with temperature, and the lug material has sufficient strength to be manufactured and to help fasten the cable.

I claim:

1. An electrical load-carrying cable connecting lug for measuring an electrical load current between a cable and an electrical circuit, comprising:
    a first end for coupling to the cable;
    a second end for coupling to the circuit; and
    a resistance sufficient to create a measurable electrical potential between the first end and the second end to determine the electrical load current.

2. The lug of claim 1, wherein the lug has a predetermined resistance value.

3. The lug of claim 1, where the predetermined resistance value of the lug varies with temperature by no greater than ±30 parts per million Celsius.

4. The lug of claim 2, wherein the predetermined resistance value of the lug is between 0.5 milliohm and 250 milliohms.

5. The lug of claim 1, wherein the resistivity of the lug material is between 300 and 3000 nano-ohm-meters.

6. The lug of claim 1, wherein the voltage drop across the lug is between 50 millivolts and 500 millivolts.

7. The lug of claim 1, wherein the heat value produced by the lug is no more than one half the heat value produced by the current source.

8. The lug of claim 1, wherein the tensile strength of the lug material is between 500 and 1500 megapascals.

9. The lug of claim 1, wherein the thermoelectric potential of the lug material versus copper is no greater than ±3 microvolts per degree Celsius.

10. The lug of claim 1, wherein the lug material is a nickel-base alloy.

11. The lug of claim 10, wherein the lug material is at least 76 parts nickel.

12. The lug of claim 10, wherein the lug material is at least 17 parts chromium.

13. The lug of claim 10, wherein the lug material is at least 4 parts silicon.

14. The lug of claim 10, wherein the lug material is at least 3 parts manganese.

* * * * *